(12) United States Patent
Yang

(10) Patent No.: US 8,021,909 B2
(45) Date of Patent: Sep. 20, 2011

(54) METHOD FOR MAKING A PLANAR CONCENTRATING SOLAR CELL ASSEMBLY WITH SILICON QUANTUM DOTS

(75) Inventor: Tsun-Neng Yang, Taipei (TW)

(73) Assignee: Atomic Energy Council - Institute of Nuclear Research, Taoyuan County (TW)

( * ) Notice: Subject to any disclaimer, the term of this patent is extended or adjusted under 35 U.S.C. 154(b) by 46 days.

(21) Appl. No.: 12/686,750

(22) Filed: Jan. 13, 2010

(65) Prior Publication Data

US 2011/0171773 A1 Jul. 14, 2011

(51) Int. Cl.
*H01L 21/00* (2006.01)

(52) U.S. Cl. ............. 438/72; 438/65; 438/69; 438/680; 136/246; 136/259; 257/E31.033

(58) Field of Classification Search ............... 136/246, 136/259, 257; 438/65, 69, 57, 680
See application file for complete search history.

(56) References Cited

U.S. PATENT DOCUMENTS

| 2010/0139765 A1* | 6/2010 | Mapel | 136/257 |
| 2010/0200044 A1* | 8/2010 | Zaban et al. | 136/246 |
| 2011/0027935 A1* | 2/2011 | Yang | 438/69 |

* cited by examiner

*Primary Examiner* — Thanh V Pham
*Assistant Examiner* — Mark A Laurenzi
(74) *Attorney, Agent, or Firm* — Jackson IPG PLLC; Demian Jackson

(57) ABSTRACT

Disclosed is a method for making a silicon quantum dot planar concentrating solar cell. At first, silicon nitride or silicon oxide mixed with silicon quantum dots is provided on a transparent substrate. By piling, there is formed a planar optical waveguide for concentrating sunlit into a small dot cast on a small solar cell.

8 Claims, 9 Drawing Sheets

METHOD FOR MAKING A PLANAR CONCENTRATING SOLAR CELL ASSEMBLY WITH SILICON QUANTUM DOTS

FIELD OF THE INVENTION

The present invention relates to a method for making a concentrating solar cell assembly and, more particularly, to a method for making a planar concentrating solar cell assembly with silicon quantum dots.

DESCRIPTION OF THE RELATED ARTS

A typical solar cell assembly includes a solar cell, a Frenzel lens for focusing sunlit onto the solar cell and a sunlit-tracking unit for aligning the solar cell to the sun. The solar cell assembly is complicated and expensive. The maintenance of the solar cell is also expensive. Moreover, an optical waveguide material used in the solar cell assembly is a glass-based material, and the configuration is coaxial, and the size is big. Therefore, it is difficult for the solar cell assembly to fit in a building.

The present invention is therefore intended to obviate or at least alleviate the problems encountered in prior art.

SUMMARY OF THE INVENTION

It is an objective of the present invention to provide a method for making an inexpensive solar cell assembly.

It is another objective of the present invention to provide a planar concentrating solar cell assembly that can easily fit in a building.

To achieve the foregoing objectives, the method includes the step of providing a substrate with a refractive index larger than that of the air so that total reflection could occur at the interface between the substrate and the air. A silicon-quantum-dot film is provided on the substrate. The silicon-quantum-dot film contains silicon quantum dots. The thickness of the silicon-quantum-dot film is 0.1 to 100 micrometers, and the size of the silicon quantum dots is 1 to 10 nanometers. A silicon-oxide film is provided on the silicon-quantum-dot film so that the substrate, the silicon-quantum-dot film and the silicon-oxide film together form a planar optical waveguide. The thickness of the silicon-oxide film is 0.1 to 10 micrometers. A solar cell is arranged near the planar optical waveguide. In operation, sunlit is cast onto the silicon quantum dots so that they refract and diffract some of the sunlit and absorb some other sunlit and hence cast re-emitted light. The refracted or diffracted sunlit and the re-emitted light reflect from the interface because of total reflection and become totally reflected light that is focused and directed to the solar cell.

In another aspect, the method comprises the steps of providing a substrate and providing a silicon-quantum-dot film on the substrate. The refractive index of the substrate is larger than that of the air so that total reflection could occur at the interface between the substrate and the air. The silicon-quantum-dot film contains silicon quantum dots. The thickness of the silicon-quantum-dot film is 0.1 to 100 micrometers, and the size of the silicon quantum dots is 1 to 10 nanometers. The two previous steps are repeated to provide optical units each comprising a substrate and a silicon-quantum-dot film. The optical units are piled. A silicon-oxide film is provided on the silicon-quantum-dot film of one of the optical units so that the optical units and the silicon-oxide film together form a planar optical waveguide. The thickness of the silicon-oxide film is 0.1 to 10 micrometers. A solar cell is arranged near the planar optical waveguide. In operation, sunlit is cast onto the silicon quantum dots of each of the optical units so that the silicon quantum dots refract and diffract some of the sunlit and absorb the other sunlit and hence cast re-emitted light. The refracted and diffracted sunlit and the re-emitted light reflect from the interface between the substrate of an optical unit and the silicon-quantum-dot film of an adjacent optical unit and the interface between the substrate and the air because of total reflection and become totally reflected light that is focused and directed to the solar cell.

Other objectives, advantages and features of the present invention will become apparent from the following description referring to the attached drawings.

BRIEF DESCRIPTIONS OF THE DRAWINGS

The present invention will be described via the detailed illustration of two embodiments referring to the drawings.

DESCRIPTION OF THE PREFERRED EMBODIMENT

Figure 1:
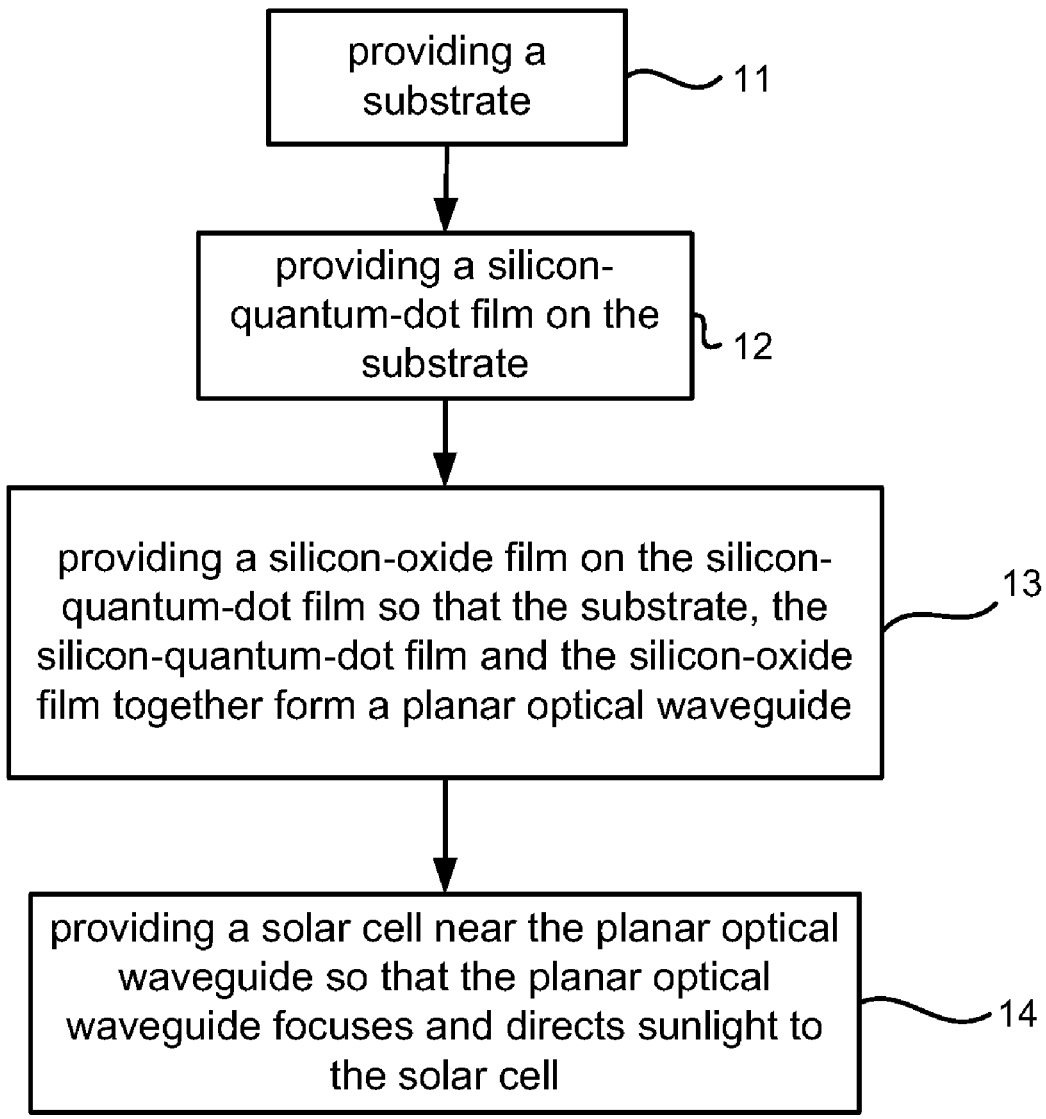
FIG. 1 is a flow chart of a method for making a silicon-quantum-dot planar concentrating solar cell assembly with according to the first embodiment of the present invention.

Referring to FIG. 1, a method for making a silicon-quantum-dot planar concentrating solar cell assembly according to a first embodiment of the present invention is shown.

Figure 2:
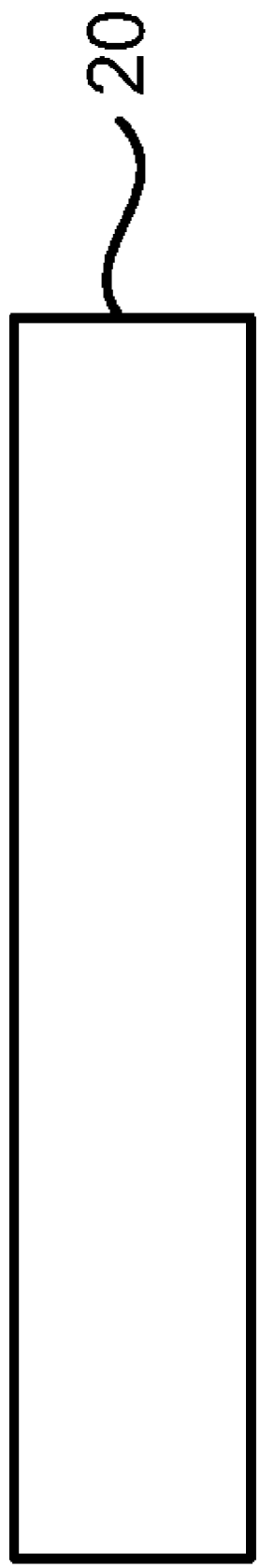
FIG. 2 is a cross-sectional view of a substrate used in the method shown in FIG. 1.

Referring to FIGS. 1 and 2, at 11, there is provided a substrate 20. The substrate 20 is a transparent plate made of glass, plastics or resin. The refractive index of the substrate 20 is larger than that of the air so that total reflection could occur at the interface between the substrate 20 and the air.

Figure 3:
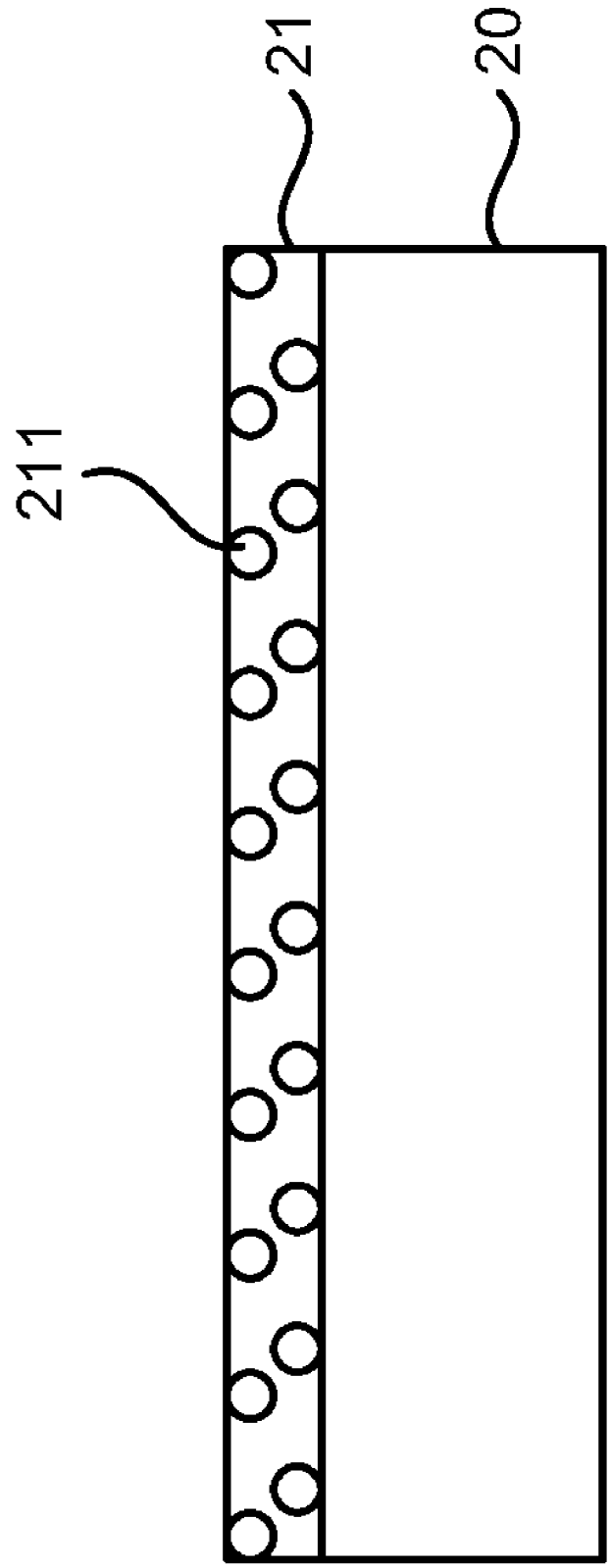
FIG. 3 is a cross-sectional view of a silicon-quantum-dot layer on the substrate shown in FIG. 2.

Referring to FIGS. 1 and 3, at 12, a silicon-quantum-dot film is provided on the substrate 20 based on a physical or chemical method. The thickness of the silicon-quantum-dot film 21 is 0.1 to 100 micrometers. The silicon-quantum-dot film 21 includes silicon quantum dots 211 evenly distributed in silicon nitride or silicon oxide. The size of the silicon quantum dots 211 is 1 to 10 nanometers.

Figure 4:
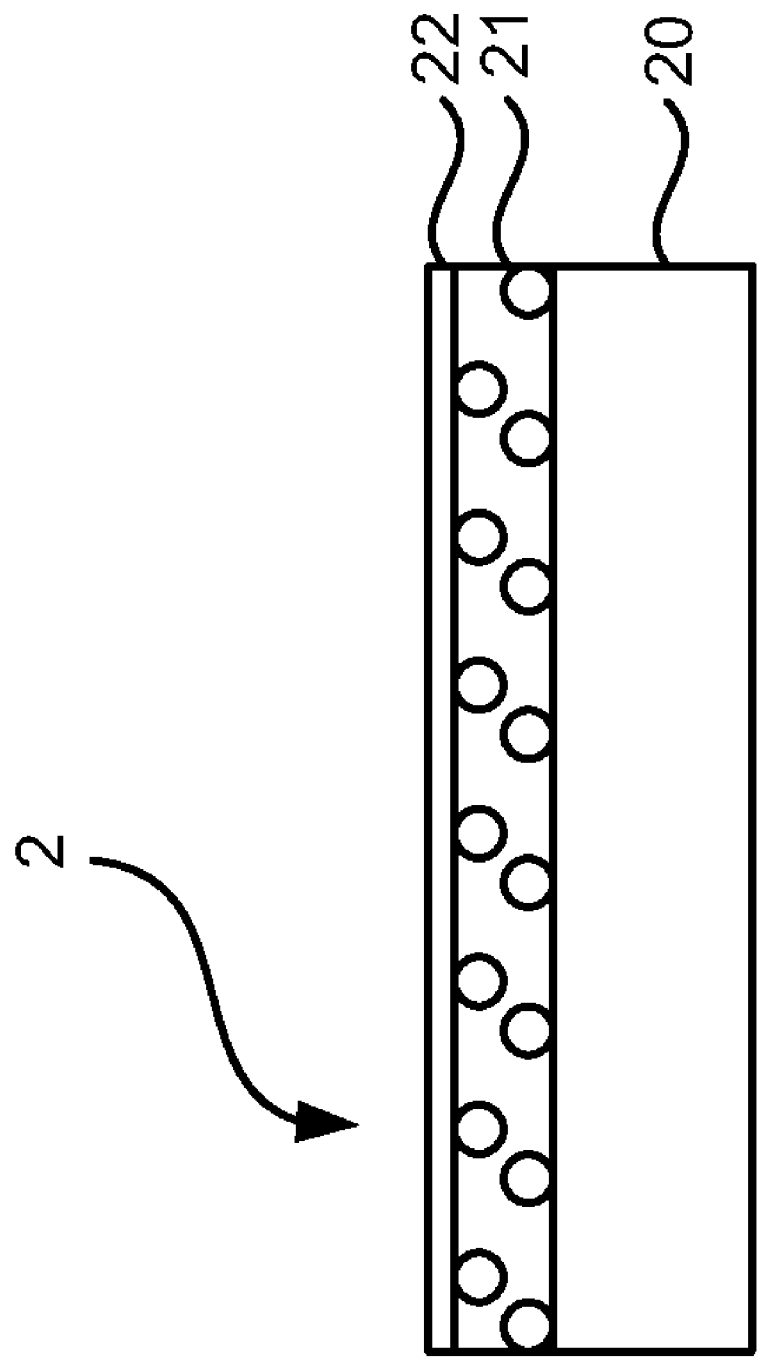
FIG. 4 is a cross-sectional view of a planar optical waveguide made by providing a silicon-oxide film on the silicon-quantum-dot layer shown in FIG. 3.

Referring to FIGS. 1 and 4, at 13, a silicon-oxide film 22 is provided on the silicon-quantum-dot film 21. Thus, the substrate 20, the silicon-quantum-dot film 21 and the silicon-oxide film 22 together form a planar optical waveguide 2. The thickness of the silicon-oxide film 22 is 0.1 to 10 micrometers.

Figure 5:
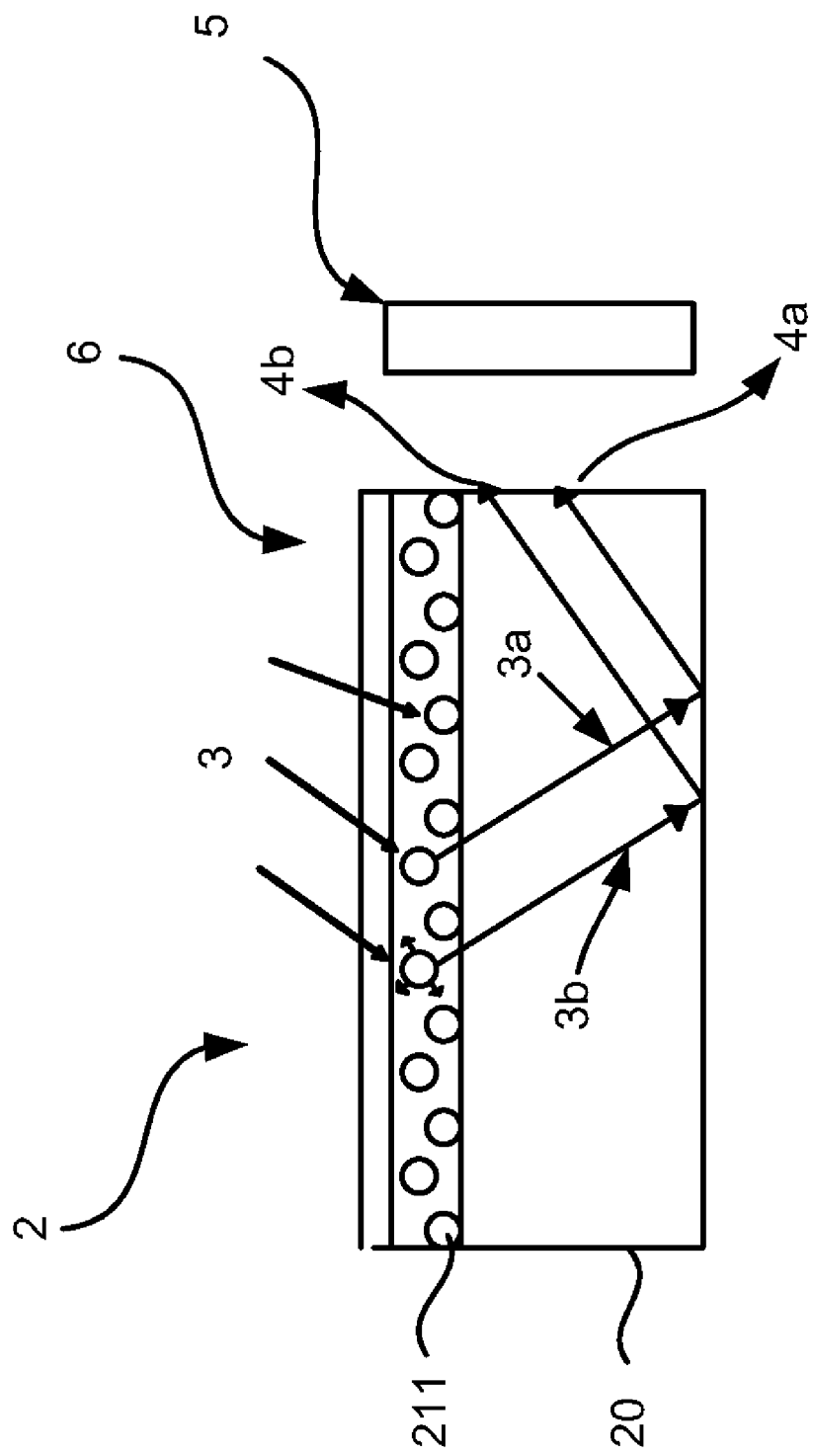
FIG. 5 is a cross-sectional view of a silicon-quantum-dot planar concentrating solar cell assembly made by providing a solar cell near the planar optical waveguide shown in FIG. 4.

Referring to FIGS. 1 and 5, at 14, a solar cell 5 is arranged near the planar optical waveguide 2. The area of the solar cell is identical to the area of a flank of the planar optical waveguide 2. Thus, the solar cell 5 and the planar optical waveguide 2 together form a silicon-quantum-dot planar concentrating solar cell assembly 6.

Figure 9:
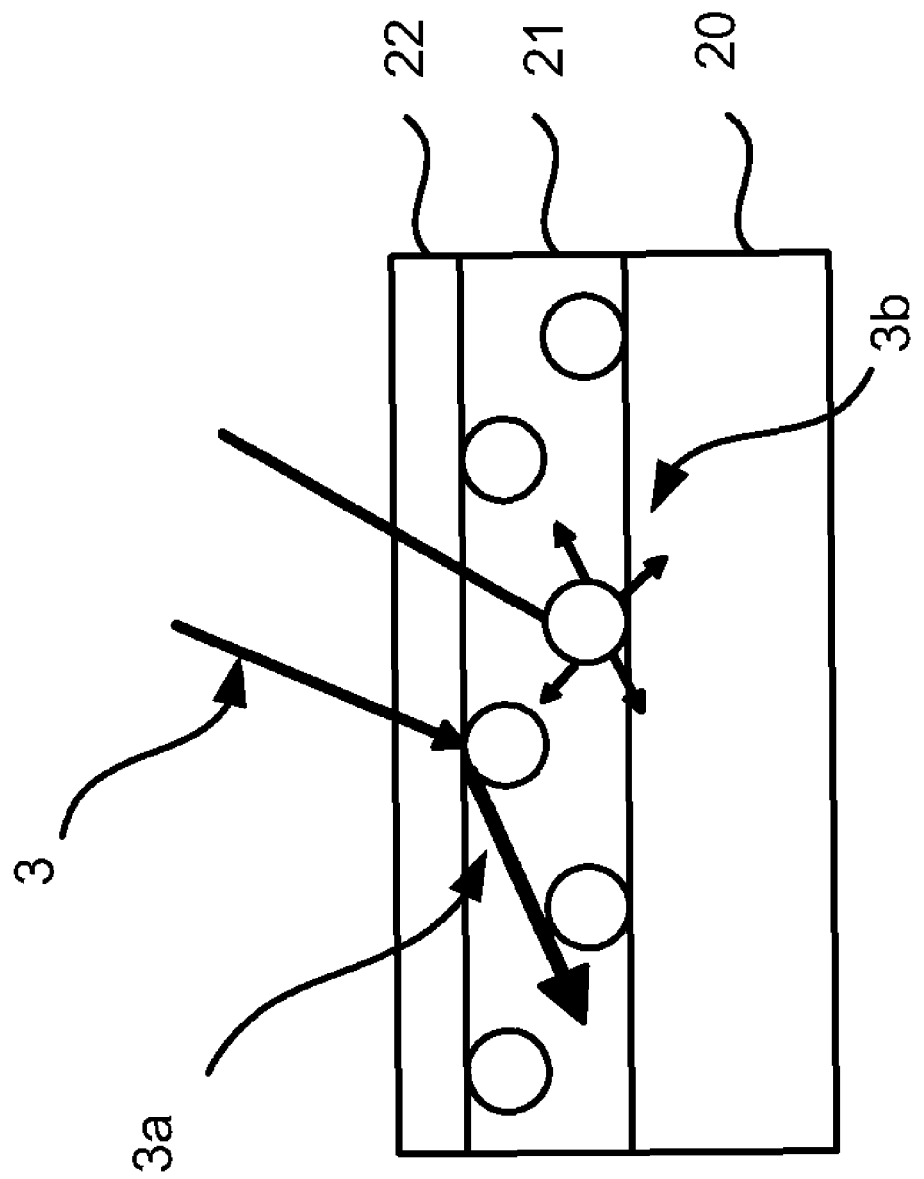
FIG. 9 is an enlarged view of the planar optical waveguide shown in FIG. 4.

Referring to FIGS. 5 and 9, in operation, sunlit 3 is cast onto the silicon quantum dots 211. The silicon quantum dots 211 refract and diffract some of the sunlit 3 into refracted and diffracted sunlit 3a. The silicon quantum dots 211 absorb the other sunlit 3 and therefore cast re-emitted light 3b. The refracted and diffracted sunlit 3a reflects from the interface between the substrate 20 and the air because of total reflection and becomes totally reflected light 4a. Similarly, the re-emitted light 3b reflects from the interface and become totally reflected light 4b. The totally reflected light 4a and 4b is focused and directed to the solar cell 5 as indicated with "4."

The concentration ratio M of the silicon-quantum-dot planar concentrating solar cell assembly 6 is calculated as follows:

$$M = A/(4 \times a);$$

wherein "A" represents the area of the substrate 20 towards the sun, and "a" stands for the area of a flank of the substrate 20.

The conversion efficiency n of the silicon-quantum-dot planar concentrating solar cell assembly 6 is determined as follows:

$$\eta = P/(S \times A);$$

wherein "P" represents the power of the silicon-quantum-dot planar concentrating solar cell assembly 6, and "S" represents the power density of the sunlit, and "A" represents the area of the substrate 20 towards the sun.

Figure 6:
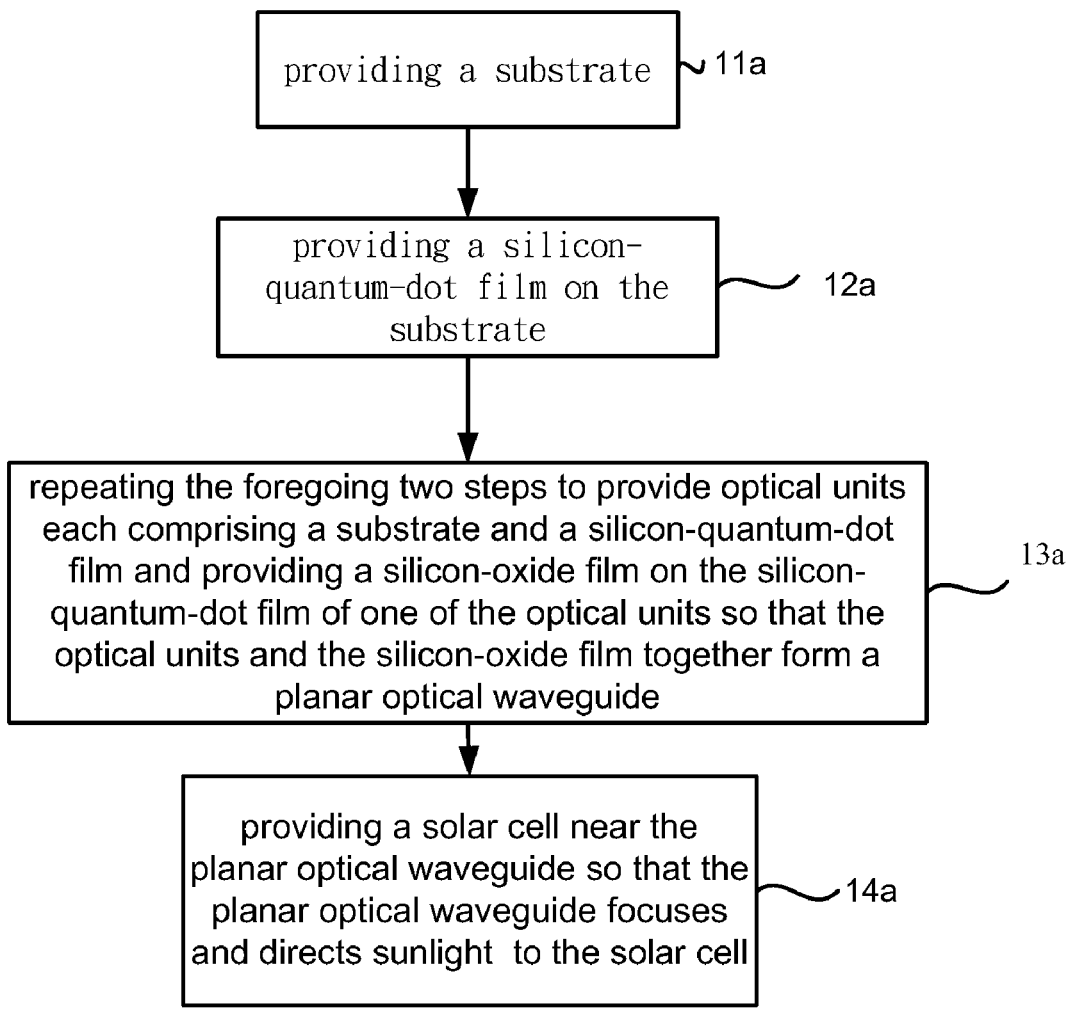
FIG. 6 is a flow chart of a method for making a planar concentrating solar cell assembly with silicon quantum dots according to the second embodiment of the present invention.

Referring to FIG. 6, a method for making a silicon-quantum-dot planar concentrating solar cell assembly according to a second embodiment of the present invention is shown.

Figure 7:
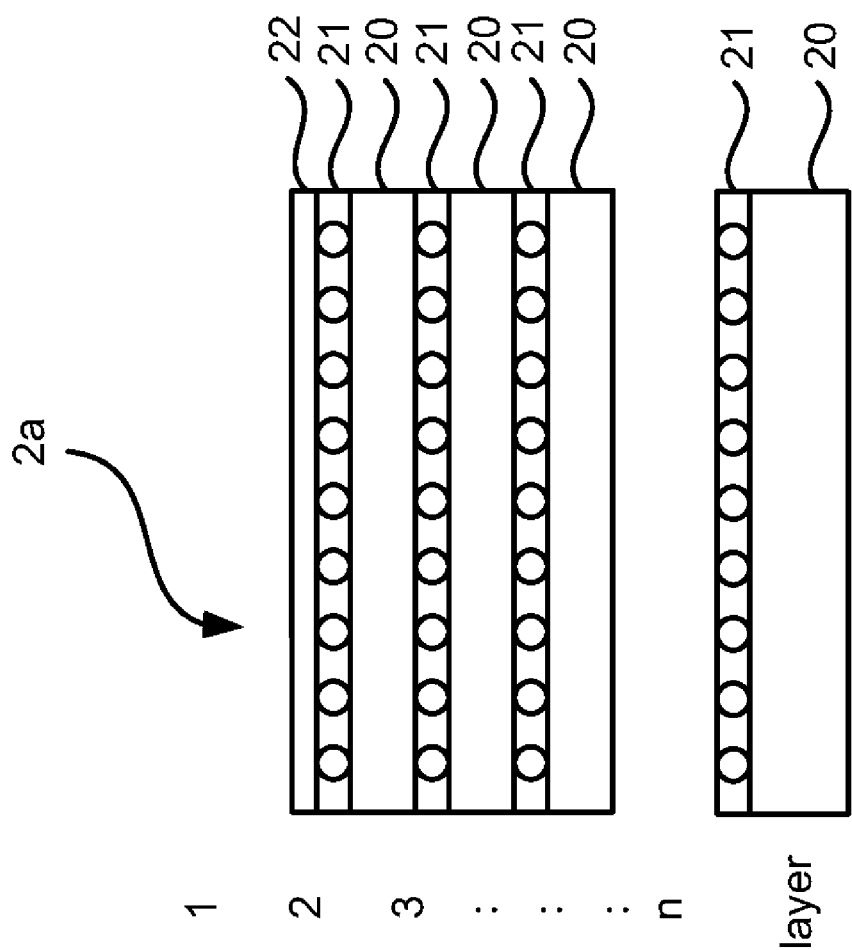
FIG. 7 is a cross-sectional view of optical units used in the method shown in FIG. 6.

Referring to FIGS. 6 and 7, at 11a, there is provided a substrate 20. The substrate 20 is a transparent plate made of glass, plastics or resin.

At 12a, a silicon-quantum-dot film 21 is provided on the substrate 20 according to a physical or chemical method. The thickness of the silicon-quantum-dot film 21 is 0.1 to 100 micrometers. The silicon-quantum-dot film 21 includes silicon quantum dots 211 evenly distributed in silicon nitride or silicon oxide. The size of the silicon quantum dots 211 is 1 to 10 nanometers.

At 13a, the two foregoing steps are repeated for a predetermined number of times to provide the predetermined number of optical units each including a substrate 20 and a silicon-quantum-dot film 21. The optical units are piled. Then, a silicon-oxide film 22 is provided on the silicon-quantum-dot film 21 of one of the optical units. Together, the substrate 20, the silicon-quantum-dot film 21 and the silicon-oxide film 22 form a planar optical waveguide 2a.

Figure 8:
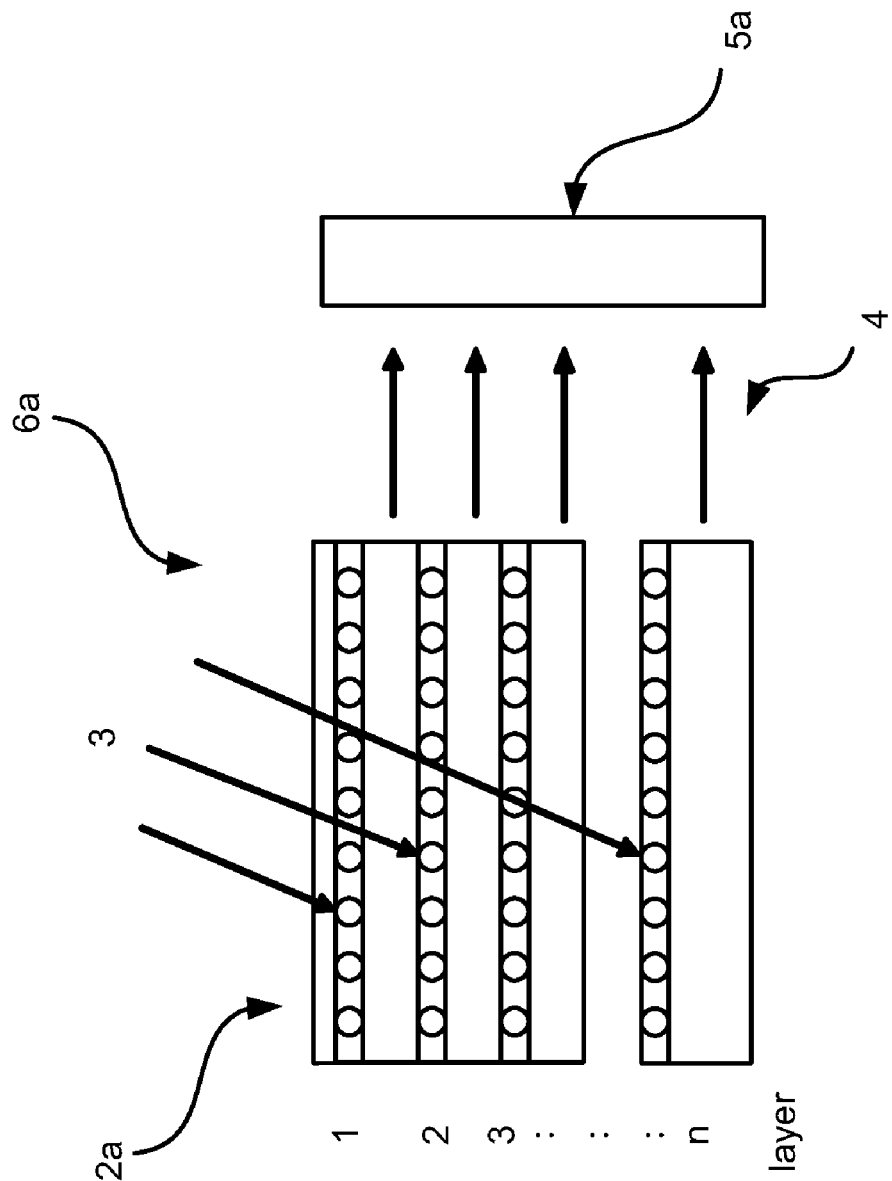
FIG. 8 is a cross-sectional view of a silicon-quantum-dot planar concentrating solar cell assembly made in the method shown in FIG. 6.

Referring to FIGS. 6 and 8, at 14a, a solar cell 5a is arranged near the planar optical waveguide 2a. The area of the solar cell 5a is identical to the area of a flank of the planar optical waveguide 2a. Together, the solar cell 5a and the planar optical waveguide 2a form a silicon-quantum-dot planar concentrating solar cell assembly 6a.

Sunlit 3 is cast onto the silicon quantum dots 211 of each of the optical units. The silicon quantum dots 211 refract and diffract some of the sunlit 3 into refracted and diffracted sunlit 3a. The silicon quantum dots 211 absorb the other sunlit 3 and therefore cast re-emitted light 3b. The refracted and diffracted sunlit 3a reflects from the interface between the substrate 20 of an optical unit and the silicon-quantum-dot film of an adjacent optical unit and the interface between the substrate 20 and the air because of total reflection and become totally reflected light 4a. Similarly, the re-emitted light 3b reflects from the interface and becomes totally reflected light 4b. The totally reflected light 4a and 4b is focused and directed to the solar cell 5 as indicated with "4." Each of the optical units focuses and directs some light to the solar cell 5a.

The silicon-quantum-dot planar concentrating solar cell assembly of the present invention exhibits several advantages. Firstly, it is made with a flat configuration so that it can easily fit in a building. Secondly, it is inexpensive because it is simple and without a light tracker. Thirdly, it is efficient.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. A method for making a silicon-quantum-dot planar concentrating solar cell assembly comprising the steps of:
   providing a substrate with a refractive index larger than that of air so that total reflection occurs at the interface between the substrate and air;
   providing a silicon-quantum-dot film on the substrate, wherein the silicon-quantum-dot film contains silicon quantum dots, wherein the thickness of the silicon-quantum-dot film is 0.1 to 100 micrometers, and the size of the silicon quantum dots is 1 to 10 nanometers;
   providing a silicon-oxide film on the silicon-quantum-dot film so that the substrate, the silicon-quantum-dot film and the silicon-oxide film together form a planar optical waveguide, wherein the thickness of the silicon-oxide film is 0.1 to 10 micrometers; and
   providing a solar cell near the planar optical waveguide, wherein sunlight is cast onto the silicon quantum dots so that they refract and diffract some of the sunlight and absorb some other sunlight and hence cast re-emitted light, wherein the refracted and diffracted sunlight and the re-emitted light reflect from the interface because of total reflection and become totally reflected light that is focused and directed to the solar cell.

2. The method according to claim 1, wherein the substrate is made of a material selected from a group consisting of glass, plastics and resin.

3. The method according to claim 1, wherein the silicon quantum dots are evenly distributed in a material selected from a group consisting of silicon nitride and silicon oxide.

4. The method according to claim 1, wherein the concentration ratio M of the silicon-quantum-dot planar concentrating solar cell assembly is calculated as follows:

$$M = A/(4 \times a);$$

wherein "A" represents the area of the substrate towards the sun, and "a" stands for the area of a flank of the substrate.

5. A method for making a silicon-quantum-dot planar concentrating solar cell assembly comprising the steps of:
   providing a substrate with a refractive index larger than that of air so that total reflection occurs at the interface between the substrate and air;
   providing a silicon-quantum-dot film on the substrate, wherein the silicon-quantum-dot film contains silicon quantum dots, wherein the thickness of the silicon-quantum-dot film is 0.1 to 100 micrometers, and the size of the silicon quantum dots is 1 to 10 nanometers;

repeating the foregoing two steps to provide optical units each comprising a substrate and a silicon-quantum-dot film, wherein the optical units are piled;

providing a silicon-oxide film on the silicon-quantum-dot film of one of the optical units so that the optical units and the silicon-oxide film together form a planar optical waveguide, wherein the thickness of the silicon-oxide film is 0.1 to 10 micrometers; and providing a solar cell near the planar optical waveguide, wherein sunlight is cast onto the silicon quantum dots of each of the optical units so that the silicon quantum dots refract and diffract some of the sunlight and absorb the other sunlight and hence cast re-emitted light, wherein the refracted and diffracted sunlight and the re-emitted light reflect from the interface between the substrate of an optical unit and the silicon-quantum-dot film of an adjacent optical unit and the interface between the air and the substrate of one of the optical units because of total reflection and become totally reflected light that is focused and directed to the solar cell.

6. The method according to claim 5, wherein the substrate is made of a material selected from a group consisting of glass, plastics and resin.

7. The method according to claim 5, wherein the silicon quantum dots are evenly distributed in a material selected from a group consisting of silicon nitride and silicon oxide.

8. The method according to claim 5, wherein the concentration ratio M of the silicon-quantum-dot planar concentrating solar cell assembly is calculated as follows:

$$M = A/(4 \times a);$$

wherein "A" represents the area of the substrate towards the sun, and "a" stands for the area of a flank of the substrate.

* * * * *